United States Patent
Chiang et al.

(10) Patent No.: US 9,433,079 B2
(45) Date of Patent: *Aug. 30, 2016

(54) CIRCUIT BOARD AND HEAT DISSIPATION DEVICE THEREOF

(71) Applicant: WISTRON CORPORATION, New Taipei (TW)

(72) Inventors: Yu-Feng Chiang, New Taipei (TW); Cheng-Hao Lee, New Taipei (TW); Chun-Lin Wang, New Taipei (TW); Tung-Huang Kuo, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/558,086

(22) Filed: Dec. 2, 2014

(65) Prior Publication Data

US 2015/0131234 A1    May 14, 2015

Related U.S. Application Data

(63) Continuation of application No. 13/611,398, filed on Sep. 12, 2012, now Pat. No. 8,941,996.

(30) Foreign Application Priority Data

Jul. 13, 2012 (TW) .............................. 101125345 A

(51) Int. Cl.
*H05K 7/20* (2006.01)
*H01L 23/40* (2006.01)
(Continued)

(52) U.S. Cl.
CPC ......... *H05K 1/0216* (2013.01); *H01L 23/4006* (2013.01); *H01L 23/4093* (2013.01);
(Continued)

(58) Field of Classification Search
CPC ..................... H01L 23/4006; H01L 23/552
See application file for complete search history.

(56) References Cited

U.S. PATENT DOCUMENTS 5,283,467 A * 2/1994 Goeschel et al. ............. 257/718
5,369,879 A * 12/1994 Goeschel et al. ............... 29/837
(Continued)

FOREIGN PATENT DOCUMENTS

TW          M407597      7/2011
TW          M410447      8/2011
WO     WO 2006070121 A1  7/2006

OTHER PUBLICATIONS

Office Action mailed Nov. 17, 2015 in corresponding CN Application 201210262074.3, and English translation of relevant portions thereof, pp. 1-16.

*Primary Examiner* — Robert J Hoffberg
(74) *Attorney, Agent, or Firm* — Muncy, Geissler, Olds & Lowe, P.C.

(57) ABSTRACT

A heat dissipation device is used in a circuit board, where the circuit board includes a chip and at least one positioning hole disposed around the chip, and each of the positioning holes has a bare metal area on its periphery. The heat dissipation device includes a heat dissipation element, a conductive element and at least one fixing part. The heat dissipation element is disposed on the chip; the conductive element is connected electrically to the bare metal area of the circuit board and the heat dissipation element respectively; the fixing part passes through the fixing holes and is connected to the positioning hole, so as to fix the heat dissipation element to the circuit board. A circuit board is also provided, which includes a substrate, a chip, a positioning hole and the heat dissipation device.

8 Claims, 9 Drawing Sheets

(51) Int. Cl.
*H01L 23/552* (2006.01)
*H05K 1/02* (2006.01)
(52) U.S. Cl.
CPC ........... *H01L23/552* (2013.01); *H05K 1/0203* (2013.01); *H01L 2924/0002* (2013.01); *H05K 2201/09063* (2013.01)

(56) References Cited

U.S. PATENT DOCUMENTS

| | | | | |
|---|---|---|---|---|
| 5,926,369 A * | 7/1999 | Ingraham | ............. | H01L 23/367 165/185 |
| 6,374,906 B1 * | 4/2002 | Peterson | ............ | H01L 23/3672 165/185 |
| 6,606,246 B2 * | 8/2003 | Wells | ............................ | 361/719 |
| 6,865,083 B2 * | 3/2005 | Liu | .................... | H01L 23/4093 165/80.2 |
| 7,042,727 B2 * | 5/2006 | Ulen | .................. | H01L 23/4006 165/80.3 |
| 7,268,425 B2 | 9/2007 | Mallik et al. | | |
| 7,327,577 B2 | 2/2008 | Gilliland et al. | | |
| 7,336,485 B2 * | 2/2008 | Leech | ....................... | G06F 1/20 361/679.48 |
| 7,456,047 B2 | 11/2008 | Mallik et al. | | |
| 7,564,690 B2 | 7/2009 | Gilliland et al. | | |
| 7,573,709 B2 | 8/2009 | Gilliland et al. | | |
| 7,656,668 B2 | 2/2010 | Lin | | |
| 7,834,446 B2 * | 11/2010 | Yajima | ................... | H01L 23/60 257/712 |
| 7,924,568 B2 | 4/2011 | Ho et al. | | |
| 8,526,185 B2 | 9/2013 | Heidepriem et al. | | |
| 2005/0068741 A1 * | 3/2005 | Bailey | ................ | H01L 23/4006 361/719 |
| 2006/0203453 A1 | 9/2006 | Chen | | |
| 2010/0309632 A1 * | 12/2010 | Chen | ..................... | H01L 23/34 361/709 |
| 2011/0182035 A1 | 7/2011 | Yajima | | |
| 2012/0092826 A1 * | 4/2012 | Heidepriem | ......... | G06F 1/20 361/679.54 |

* cited by examiner

CIRCUIT BOARD AND HEAT DISSIPATION DEVICE THEREOF

CROSS-REFERENCES TO RELATED APPLICATIONS

This application is a continuation application of U.S. application Ser. No. 13/611,398 filed in U.S. on Sep. 12, 2012, which itself claims priority under 35 U.S.C. §119(a) of patent application Ser. No. 101125345 filed in Taiwan, R.O.C. on Jul. 13, 2012, the entire contents of which are hereby incorporated by reference.

BACKGROUND OF THE INVENTION

1. Technical Field

The present disclosure relates to a circuit board and a heat dissipation device thereof.

2. Related Art

With the continuous development of technologies, the present consumer electronic products have a more and more intensive process due to an increasingly growing working clock of processing chips (CPU/Scalar). Processing chip power is becoming increasingly higher; accordingly, heat generated by the processing chips may be accumulated, resulting in internal elements being damaged, or working efficiency being reduced. In the prior art, heat dissipation devices are additionally disposed on processing chips, and the heat accumulation problem of the processing chips is resolved using the heat dissipation devices.

However, during operation a chip generates signals unexpected by a system or even signals adversely affecting the operation, and an adjacent heat dissipation device receives a high-frequency noise generated by the chip. However, because of the disposition of the heat dissipation device, especially a heat dissipation fin, which is not conductively connected to a circuit board where the chip is located, the high-frequency noise generated by the chip is coupled to the heat dissipation fin and has no path for elimination. Consequently, in a wireless transmission mariner, the high-frequency noise radiates out by using the heat dissipation fin as an antenna. As a result, adjacent electronic elements are subject to interference of the high-frequency noise, resulting in that the system is unstable or has unexpected problems.

Therefore, high heat-accumulation caused due to the high-clock operation of the processing chips may be resolved by disposing the heat dissipation devices. However, after the heat dissipation devices are disposed, the high-frequency noise generated due to the high-clock operation of the chips is radiated to a surrounding environment by using the heat dissipation devices as antennas, and an electromagnetic interference problem arises spontaneously.

In conclusion, the circuit boards and the heat dissipation devices thereof in the prior art have an electromagnetic interference problem resulting from that high-frequency noise generated during a high-speed operation of chips, radiates out through heat dissipation elements.

SUMMARY

Accordingly, the present disclosure provides a heat dissipation device, used in a circuit board, where the circuit board includes a chip and at least one positioning hole disposed around the chip, and each of the positioning holes has a bare metal area on its periphery. The heat dissipation device includes a heat dissipation element, a conductive element and at least one fixing part. The heat dissipation element is disposed on the chip and has at least one fixing hole. The conductive element is connected electrically to the bare metal area of the circuit board and the heat dissipation element respectively. The fixing part passes through each of the fixing holes and is connected to each of the positioning holes, so as to fix the heat dissipation element to the circuit board.

The present disclosure further provides a circuit board, including a substrate, a chip, a heat dissipation element, at least one fixing part, and a conductive element. The substrate has at least one positioning hole, and each of the positioning holes has a bare metal area on its periphery. The chip is disposed on the substrate and located between the positioning holes. The heat dissipation element is disposed on the chip and has at least one fixing hole. The fixing part passes through the fixing hole and is connected to the positioning hole, so as to fix the heat dissipation element to the substrate. The conductive element is connected electrically to the bare metal area and the heat dissipation element respectively.

One of the characteristics of the present disclosure lies in that, a conductive element is additionally added to a heat dissipation device in the prior art, and the conductive element of the heat dissipation device is enabled to be connected electrically to a heat dissipation element and a bare metal area, so that the heat dissipation element is grounded, thereby resolving the electromagnetic interference problem resulting from that a high-frequency noise generated during the computation of a chip radiates out by using the heat dissipation element as an antenna.

The detailed features and advantages of the present disclosure are described below in great detail through the following embodiments, the content of the detailed description is sufficient for persons skilled in the art to understand the technical content of the present disclosure and to implement the present disclosure there accordingly. Based upon the content of the specification, the claims, and the drawings, any persons skilled in the art can easily understand the relevant objectives and advantages of the present disclosure.

BRIEF DESCRIPTION OF THE DRAWINGS

The disclosure will become more fully understood from the detailed description given herein below for illustration only, and thus not limitative of the present disclosure, wherein.

DETAILED DESCRIPTION

Figure 1A:
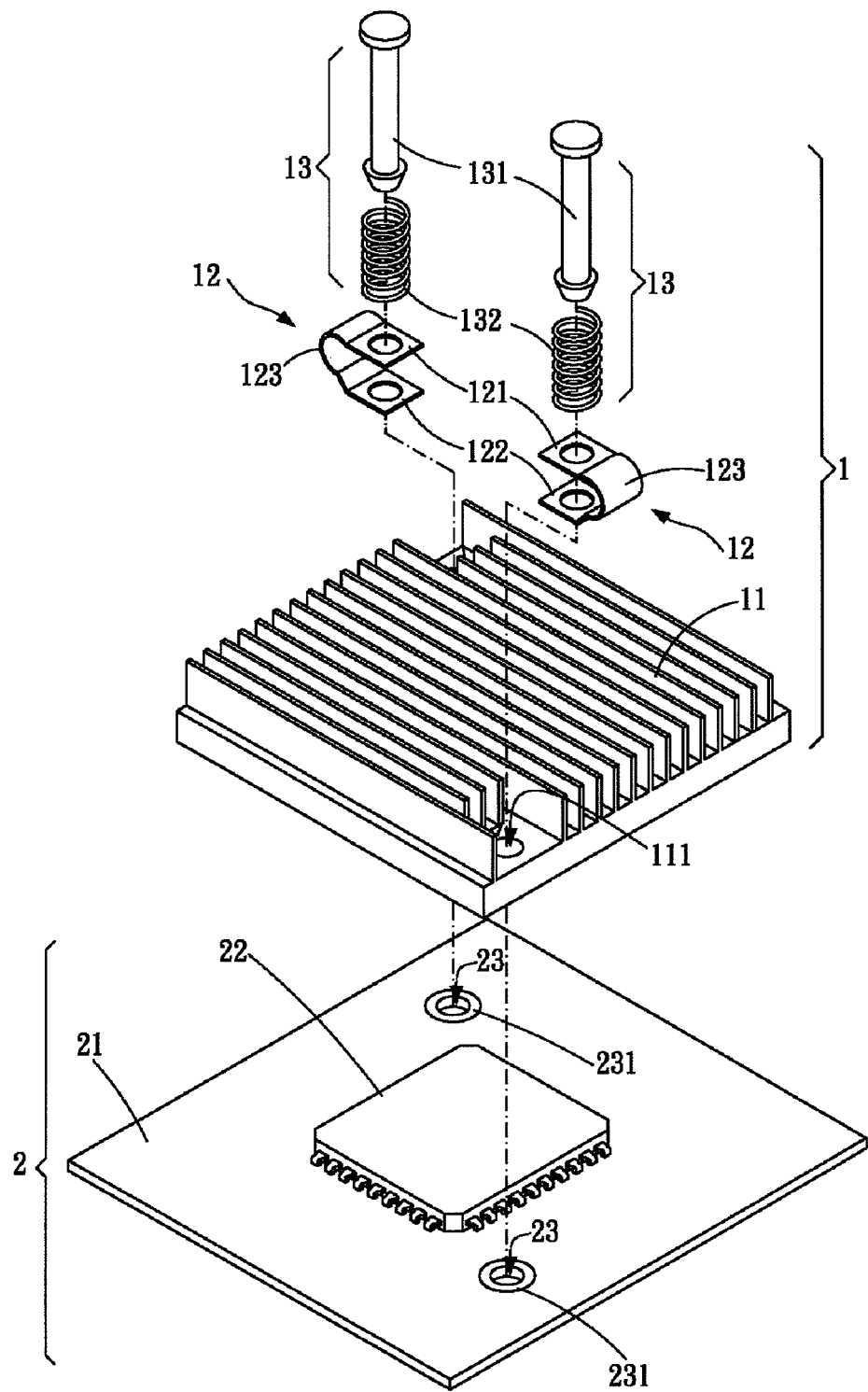
FIG. 1A is an explosive view of a first embodiment of the present disclosure.
Figure 1B:
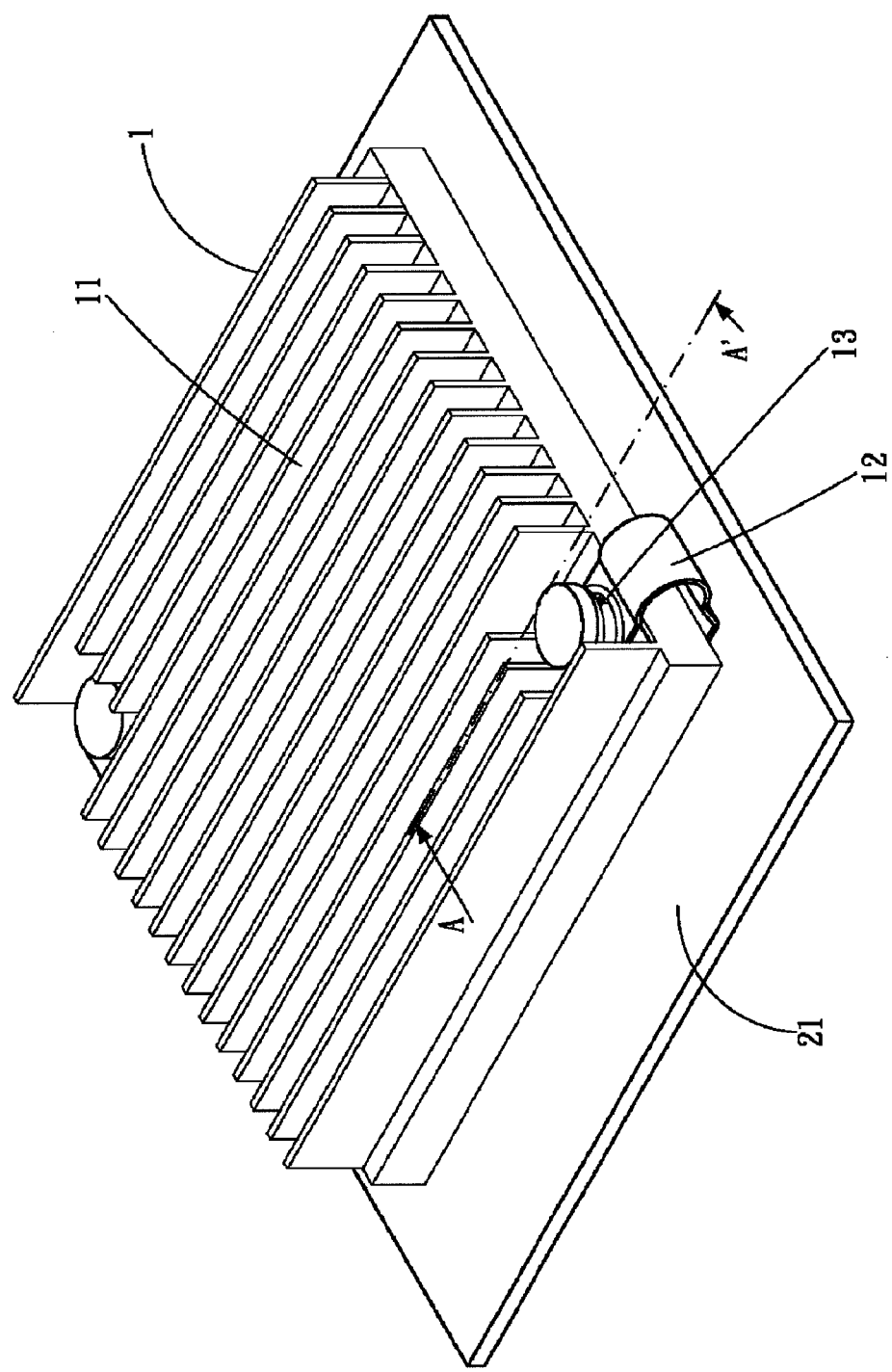
FIG. 1B is an assembly view of the first embodiment of the present disclosure.
Figure 1C:
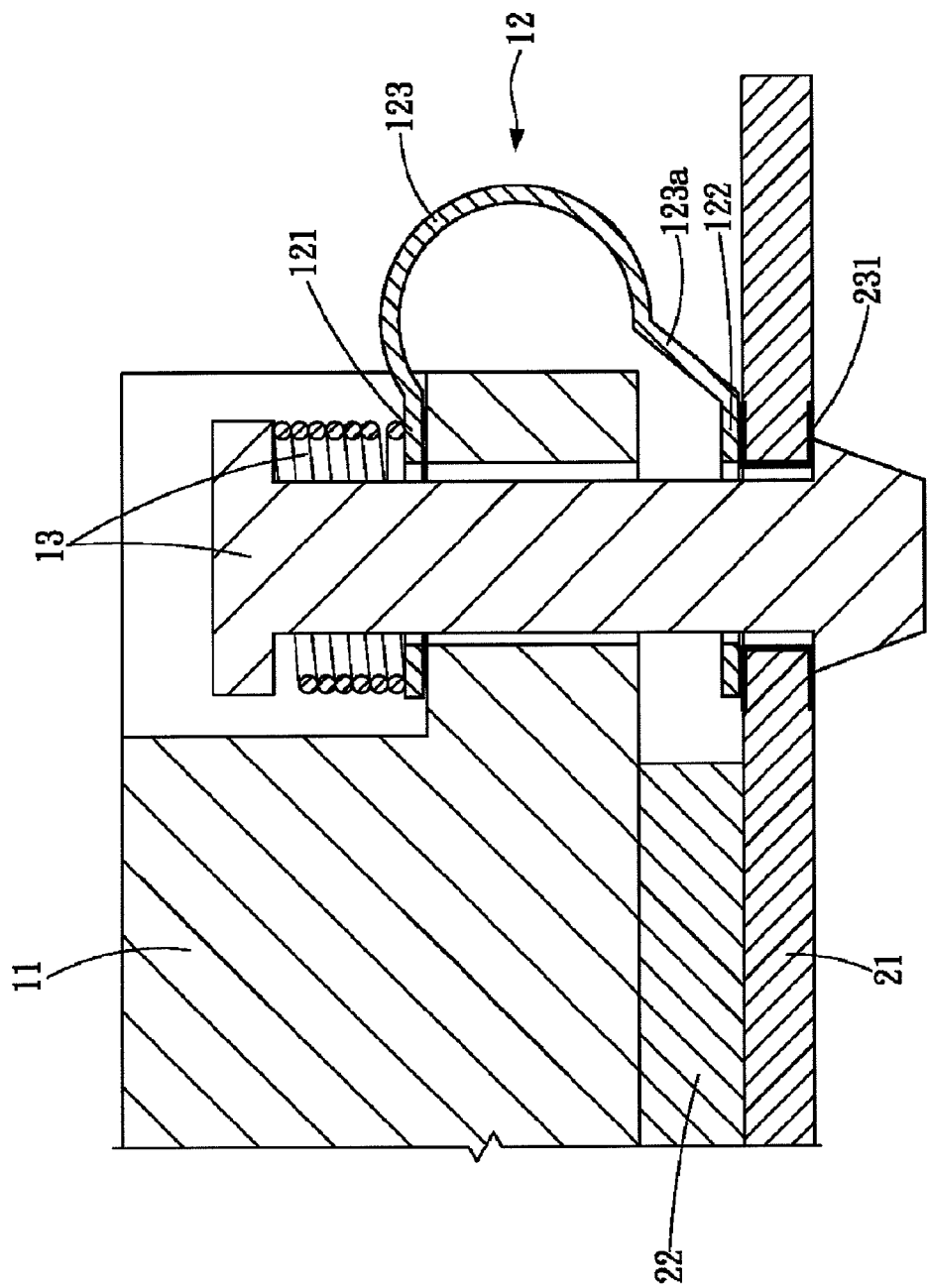
FIG. 1C is a sectional view along a section line AA' of FIG. 1B.

FIGS. 1A to 1C are respectively an explosive view of a first embodiment of the present disclosure, an assembly view of the first embodiment of the present disclosure, and a sectional view along a section line AA' of FIG. 1B. Please refer to FIGS. 1A to 1C, in which a heat dissipation device 1 is provided, used in a circuit board 2. The circuit board 2 includes a substrate 21, a chip 22, and at least one positioning hole 23. Each of the positioning holes 23 is disposed around the chip 22, and each of the positioning holes 23 has a bare metal area 231 on its periphery. The heat dissipation device 1 includes a heat dissipation element 11, a conductive element 12 and at least one fixing part 13.

The heat dissipation element 11 is disposed on the chip 22, and contacts with the chip 22 face to face to receive heat generated during high-speed computation of the chip 22. The heat dissipation element 11 has multiple heat dissipation fins on the other surface with respect to a contact surface, so as to increase a heat dissipation area of the heat dissipation element. Additionally, in an embodiment, a heat pipe (not shown), passes through the heat dissipation element 11, and a fan (not shown), is disposed above the heat dissipation fins, to further enhance a heat dissipation effect.

The conductive element 12 is connected electrically to the bare metal area 231 of the circuit board 2 and the heat dissipation element 11 respectively, and the heat dissipation element 11 is connected electrically to the bare metal area 231 through the conductive element 12. The bare metal area 231 may be a copper bare area on the circuit board 2. On a circuit layout of the circuit board 2, a potential of the bare copper area is generally 0. Therefore, when the heat dissipation element 11 is connected electrically to the circuit board 2 through the conductive element 12, equivalently, the conductive element 12 is grounded. As a result, when a high-frequency noise generated during computation of the chip 22 is coupled to the heat dissipation element 11, the high-frequency noise may be eliminated as the conductive element 12 is grounded, causing no electromagnetic interference to other electronic components.

Each of the fixing parts 13 respectively passes through each of the positioning holes 23 to fix and position the heat dissipation element 11 to the circuit board 2. A push-pin is a common fixing part 13, whose structure mainly includes a pin main body 131 and a metal spring 132, where the metal spring 132 is sleeved to an outer edge of the pin main body 131.

Figure 2A:
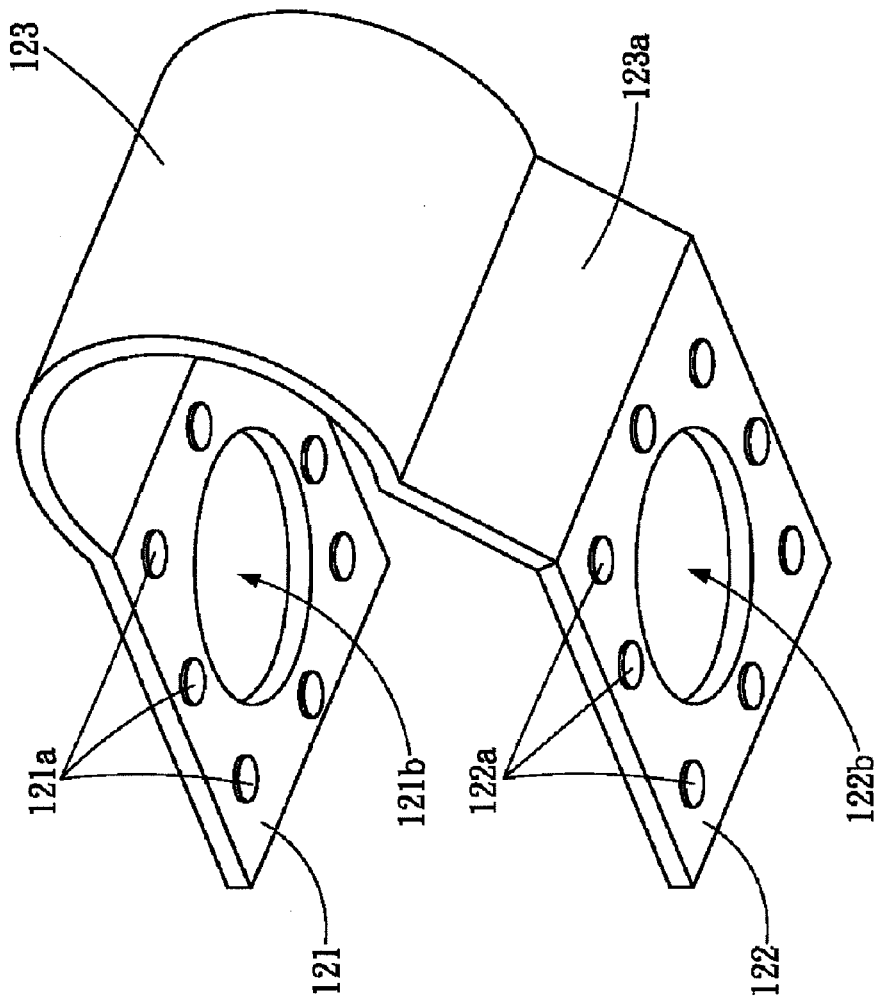
FIG. 2A is a schematic diagram 1 of a conductive element according to the first embodiment of the present disclosure.

FIG. 2A is a schematic diagram 1 of a conductive element according to a first embodiment of the present disclosure. Please refer to FIG. 2A, in which a conductive element 12 is provided, where the conductive element 12 includes a first junction 121, a second junction 122 and a bridge portion 123. The first junction 121 is in direct contact with the heat dissipation element 11 to be connected electrically to the heat dissipation element 11. The second junction 122 is in direct contact with the bare metal area 231 on the periphery of the positioning hole 23 to be connected electrically to bare metal area the bare metal area 231. Two ends of the bridge portion 123 are connected electrically to the first junction 121 and the second junction 122 respectively. In addition, the bridge portion 123 has flexibility and provides an elastic force to enable the second junction 122 to press against the bare metal area 231. The heat dissipation element 11 is connected electrically to the bare metal area 231 through the first junction 121, the bridge portion 123 and the second junction 122.

In an embodiment, the first junction 121 has a first through hole 121b and at least one first bulge 121a distributed around the first through hole 121b, where the first junction 121 is connected electrically to the heat dissipation element 11 through the first bulge 121a. Additionally, the second junction 122 has a second through hole 122b and at least one second bulge 122a distributed around the second through hole 122b, where the second junction 122 is connected electrically to the bare metal area 231 through the second bulge 122a. The conductive element 12 is generally made of a metal material, so the first junction 121 and the second junction 122 may be made unparallel during a manufacturing procedure. Moreover, the circuit board 2 may more or less have a warping phenomenon, instead of a uniformly flat surface. Therefore, when the first junction 121 contacts with the heat dissipation element 11, it is possible that, instead of a surface contact, a point contact occurs. Likewise, when the second junction 122 contacts with the bare metal area 231 of the circuit board 2, a similar problem may also occur. According to the electronic principles, when an electrical contact manner between two conductors changes from the surface contact to the point contact, a contact resistance greatly increases, whereas the increasing of the contact resistance reduces a noise elimination effect of the conductive element 12 of the present disclosure. Therefore, by disposing the first bulge 121a and the second bulge 122a respectively on the first junction 121 and the second junction 122, when the first junction 121 and the second junction 122 are unparallel or a warping phenomenon exists on the surface of the circuit board 2, the greatly increased contact resistance may be effectively alleviate.

Figure 2B:
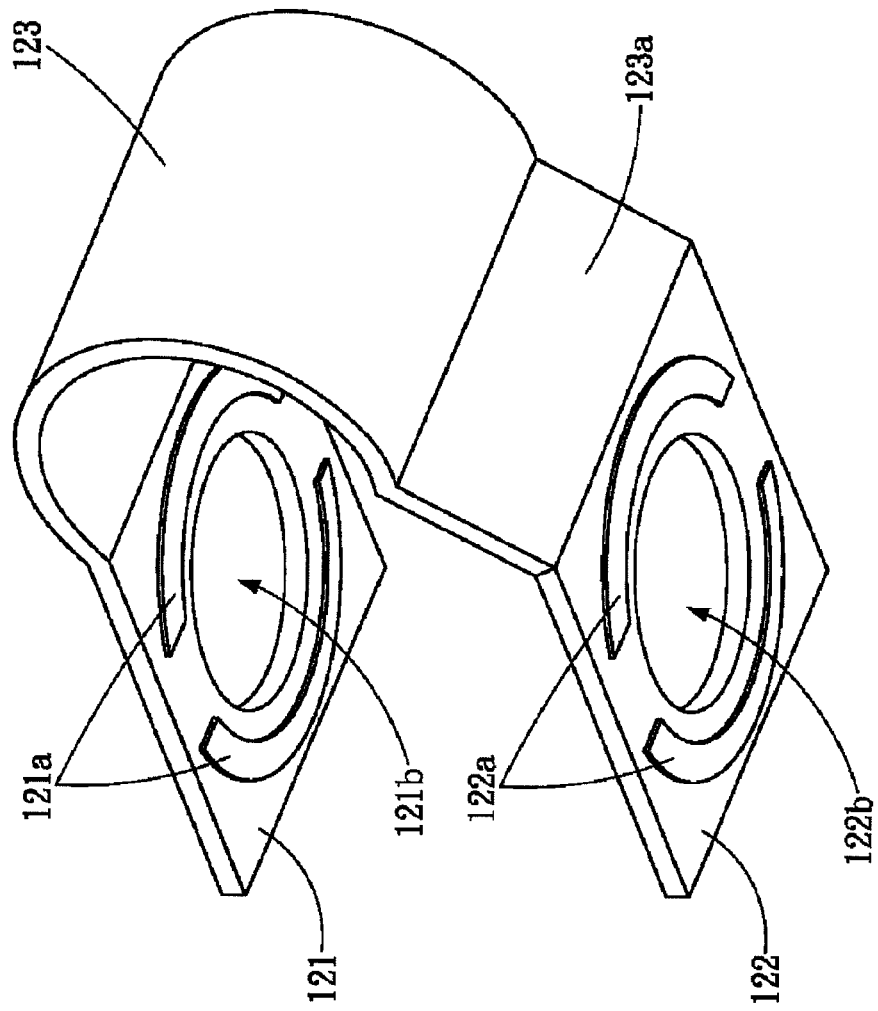
FIG. 2B is a schematic diagram 2 of a conductive element according to the first embodiment of the present disclosure.

FIG. 2B is a schematic diagram 2 of a conductive element according to a first embodiment of the present disclosure. Please refer to FIG. 2B, in which in addition to the multiple point-like bulges shown in FIG. 2A, the foregoing first bulge 121a and the second bulge 122a may also be two symmetrical semi-circular bulges shown in FIG. 2B, but the present disclosure is not limited thereto.

Please refer to FIG. 1A and FIG. 2A, in this embodiment, the heat dissipation element 11 has a fixing hole 111 corresponding to the first through hole 121b and the second through hole 122b. The pin main part 131 of the fixing part 13 passes through the first through hole 121b, the fixing hole 111 and the second through hole 122b in sequence, and then is inserted into the positioning hole 23 of the circuit board 2, to fix the heat dissipation element 11 to the circuit board 2. The metal spring 132 of the fixing part 13 further presses the first junction 121, so that the first junction 121 electrically contacts with a surface of the heat dissipation element 11. Additionally, because a distance from the first junction 121 to the second junction 122 is a slightly larger than a distance from a contact surface of the heat dissipation element 11 and the first junction 121 to the bare metal area 231, the conductive element 12 is in compressed state. Moreover, the flexible bridge portion 123 provides an elastic force for the second junction 122, so that the second junction 122 presses against and electrically contacts with the bare metal area 231 of the circuit board 2.

Please refer to FIG. 2A, in which in another embodiment, the bridge portion 123 is connected to the second junction 122 through an inclined plane 123a. When the second junction 122 presses against the bare metal area 231, an angle is formed between the inclined plane 123a and the circuit board 2 to enable the bridge portion 123 to keep a distance from the circuit board 2, so as to avoid a short circuit resulting from that the conductive element 12 accidentally contacts with other electronic elements or lines on the circuit board 2. The angle may be 45°, 60° or 75°, but the present disclosure is not limited thereto.

Figure 2C:
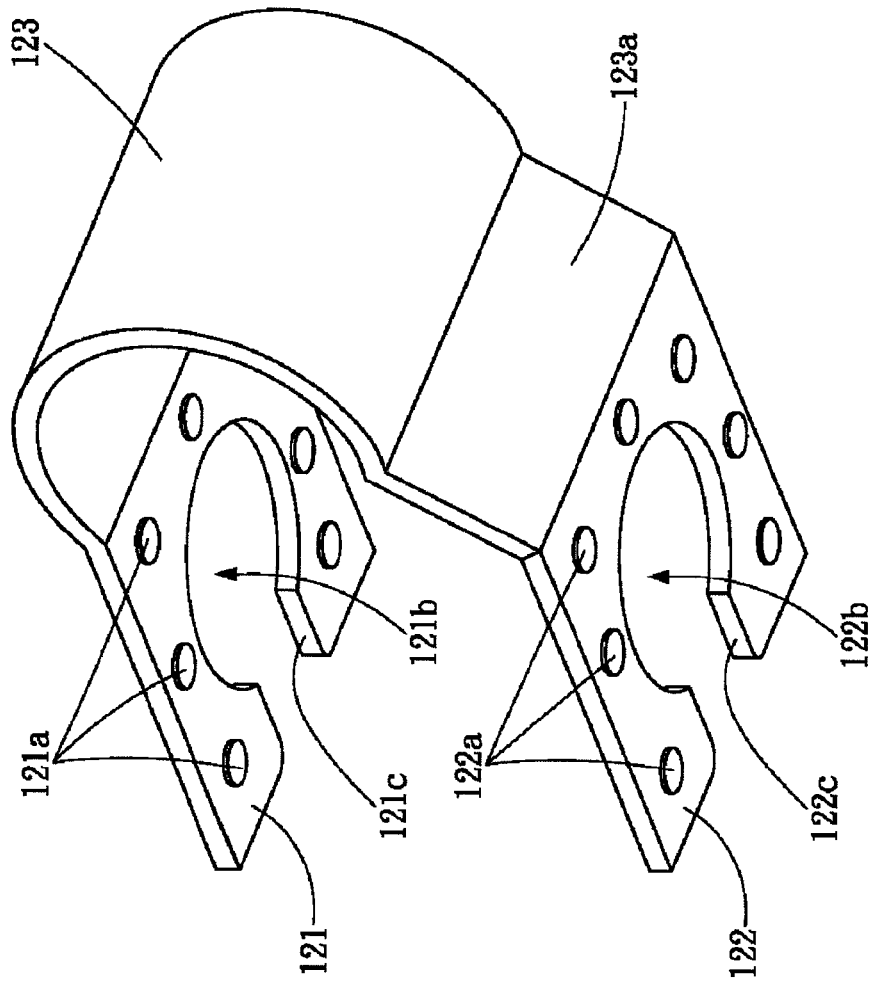
FIG. 2C is a schematic diagram 3 of a conductive element according to the first embodiment of the present disclosure.

Please refer to FIG. 2C, in which in another embodiment, the first through hole 121b has a first notch 121c, and the second through hole 122b has a second notch 122c, so that the conductive element 12 may be directly clamped to the pin main body 131 of the fixing part 13 through the first notch 121c and the second notch 122c. Likewise, the metal spring 132 of the fixing part 13 presses the first junction 121, so that the first junction 121 electrically contacts with the surface of the heat dissipation element 11, and the bridge portion 123 provides an elastic force, so that the second junction 122 presses against and electrically contacts with the bare metal area 231.

Figure 3A:
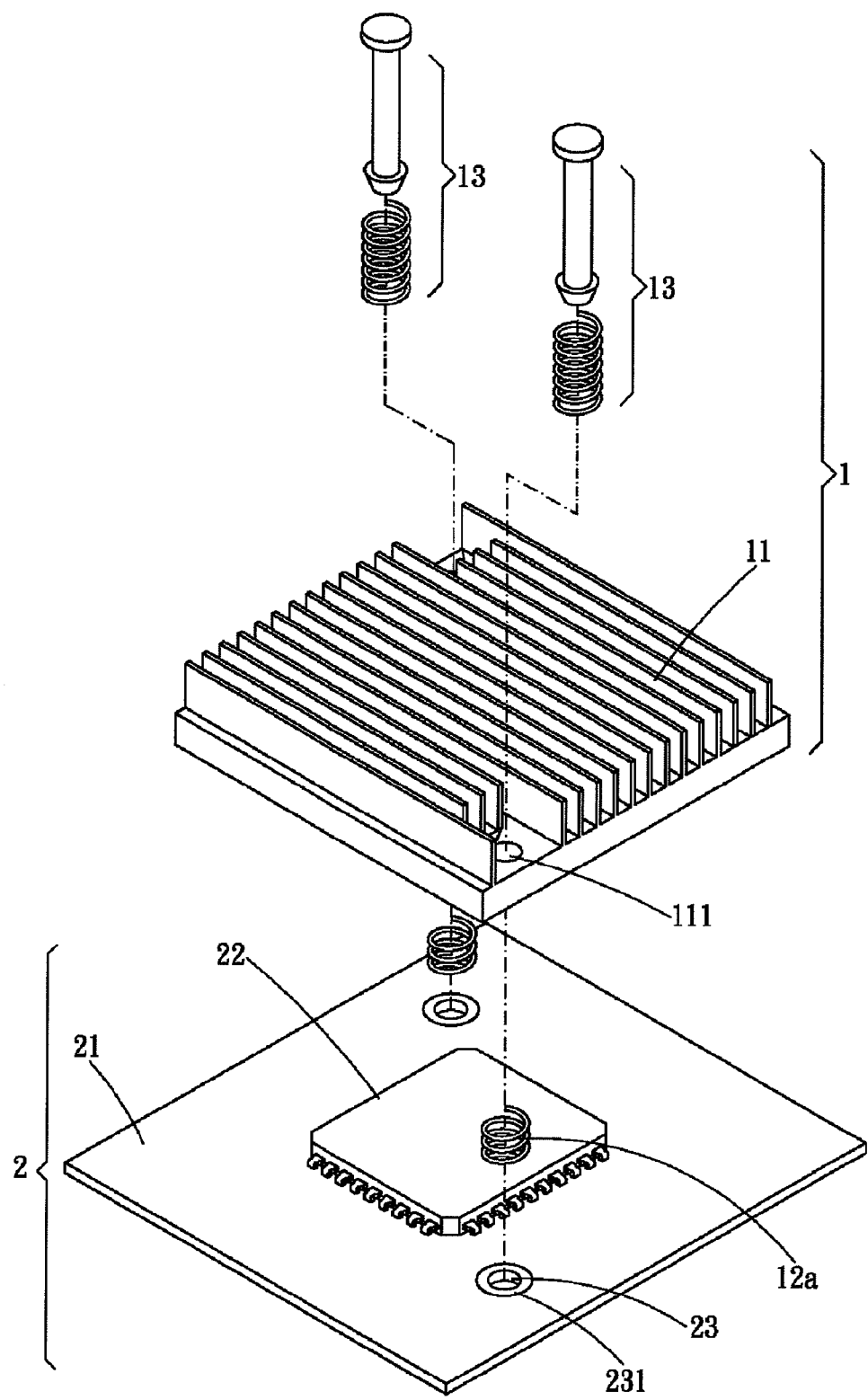
FIG. 3A is an explosive view of a second embodiment of the present disclosure.
Figure 3B:
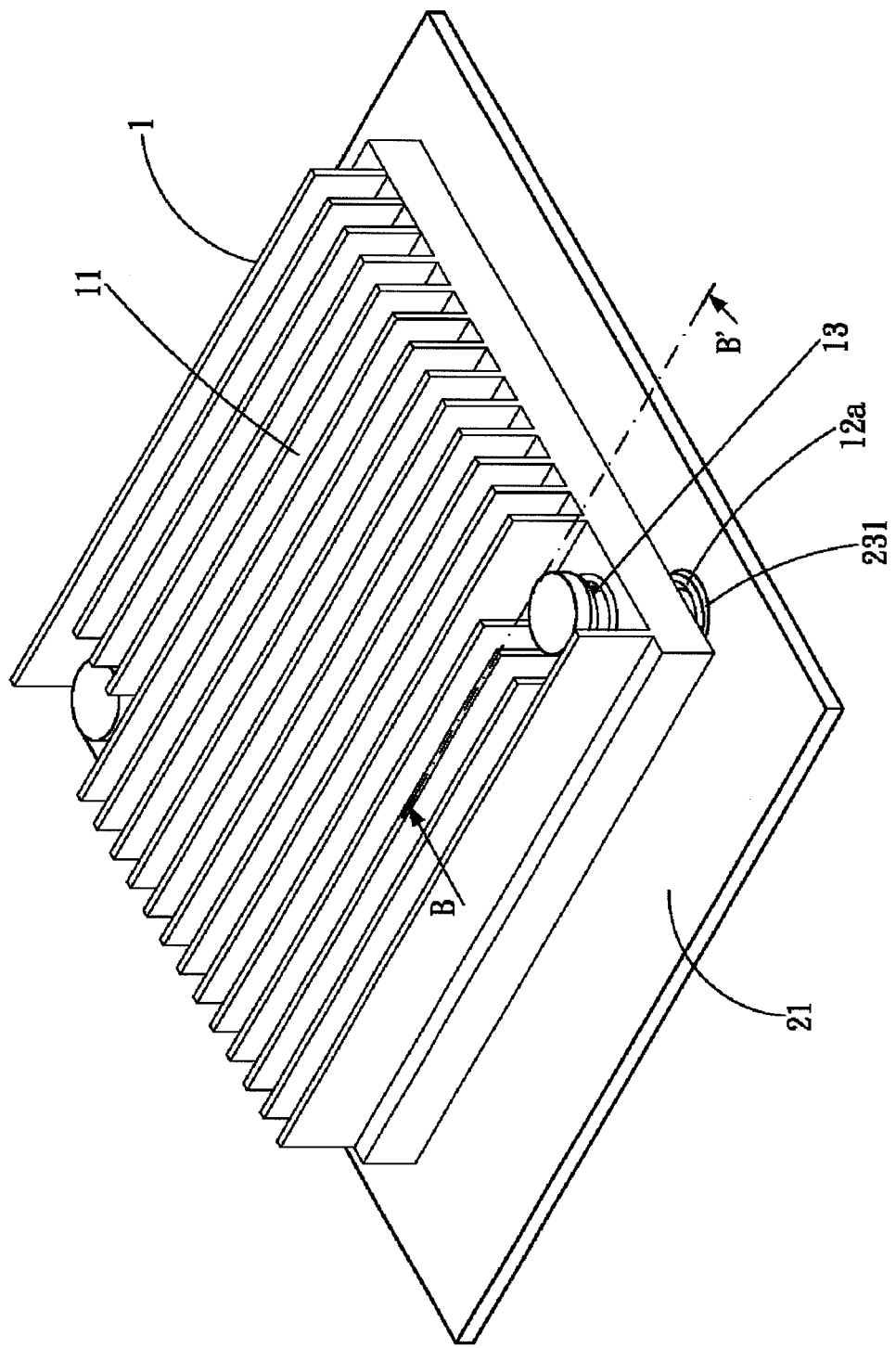
FIG. 3B is an assembly view of a second embodiment of the present disclosure.
Figure 3C:
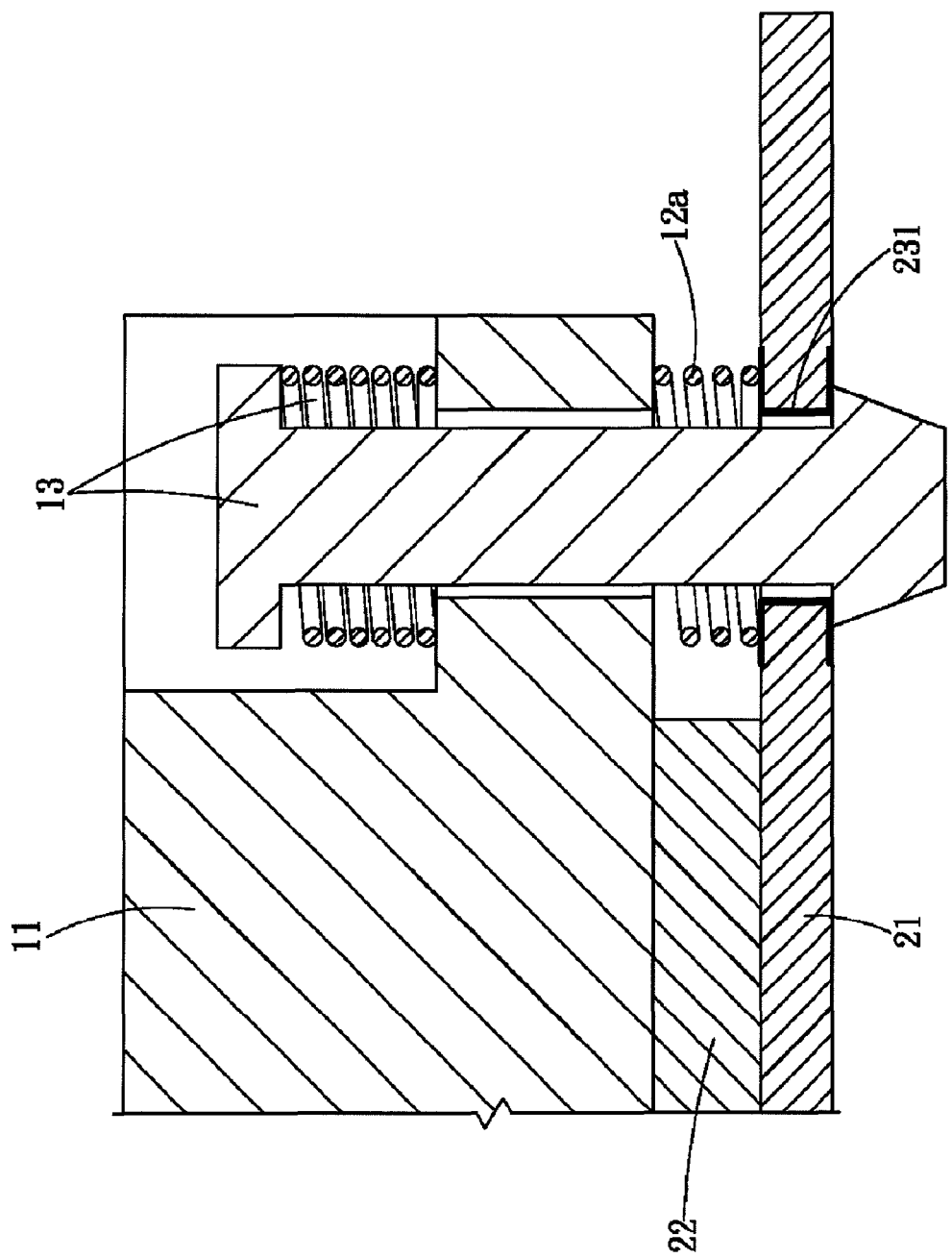
FIG. 3C is a sectional view along a section line BB' of FIG. 3B.

FIGS. 3A to 3C are respectively an explosive view of a second embodiment of the present disclosure, an assembly view of the second embodiment of the present disclosure, and a sectional view along a section line BB' of FIG. 3B. Please refer to FIGS. 3A to 3C, in which the main difference between this embodiment and the first embodiment lies in that, the conductive element is a spring 12a made of a conductive material. The spring 12a is disposed between the heat dissipation element 11 and the circuit board 2, with one end pressing against the bare metal area 231 of the circuit board 2 and the other end pressing against a surface of the heat dissipation element 11 facing the circuit board 2. The fixing part 13 passes through the fixing hole 111 and the spring 12a in sequence, and then is inserted into the positioning hole 23 of the circuit board 2, to fix the heat dissipation element 11 and the spring 12a to the circuit board 2. The fixing part 13 presses the heat dissipation element 11, to further compress a length of the spring 12a disposed between the heat dissipation element 11 and the circuit board 2, so that both ends of the spring 12a respectively press against the heat dissipation element 11 and the bare metal area 231 through an elastic force. In this embodiment, the heat dissipation element 11 is connected electrically to the bare metal area 231 of the circuit board 2 through the spring 12a; therefore, a noise coupled to the heat dissipation element 11 during high-speed computation of the chip 22 can also be eliminated through the grounding.

According to the foregoing embodiments, the present disclosure further provides a circuit board, including the substrate 21, the chip 22, the heat dissipation element 11, the fixing part 13 and the conductive element 12 in the foregoing embodiments. When a high-frequency noise generated by the chip of the circuit board is coupled to the heat dissipation element 11, the noise may be eliminated as the conductive element 12 is grounded, so that the high-frequency noise fails to cause electromagnetic interference to other electronic elements on the circuit board or other electronic devices around the circuit board by using the heat dissipation element 11 as an antenna.

While the present disclosure has been described by the way of example and in terms of the preferred embodiments, it is to be understood that the disclosure need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A heat dissipation device, used in a circuit board, wherein the circuit board comprises a chip and at least two positioning holes, two of the at least two positing holes being diagonally disposed around the chip, each of the positioning holes has a corresponding bare metal area, each corresponding bare metal area is located on a peripheral of a corresponding position hole of the at least two positioning holes, and the heat dissipation device comprises:

a heat dissipation element, disposed on the chip and having at least two fixing holes and a plurality of heat dissipation fins, wherein each of the fixing holes is located between the plurality of heat dissipation fins;

conductive elements, each contacted with the corresponding bare metal area and the heat dissipation element, and connected electrically to the corresponding bare metal area and the heat dissipation element, each of the conductive elements comprises a first junction, a second junction and a bridge portion, wherein the first junction is connected electrically to the heat dissipation element, the second junction has at least two second semi-circular bulges, the second junction is connected electrically to the corresponding bare metal area through at least one of the second semi-circular bulges, two ends of the bridge portion are connected electrically to the first junction and the second junction respectively, and the bridge portion provides an elastic force, so that the second junction presses against the corresponding bare metal area; and at least two fixing parts, each of the fixing parts passing through a corresponding fixing hole of the fixing holes and connected to the corresponding positioning hole, so as to fix the heat dissipation element to the circuit board.

2. The heat dissipation device according to claim 1, wherein the first junction has a first through hole, the second junction has a second through hole, and a corresponding fixing part of the fixing parts passes through the first through hole, the corresponding fixing hole, and the second through hole to press the first junction to a surface of the heat dissipation element.

3. The heat dissipation device according to claim 1, wherein the fixing part comprises a spring, the spring presses against the first junction so that the first junction electrically contacts with a surface of the heat dissipation element.

4. The heat dissipation device according to claim 1, wherein the first junction has at least two first semi-circular bulges, and the first junction is connected electrically to the heat dissipation element through at least one of the first semi-circular bulges.

5. A circuit board, comprising, a substrate, having at least two positioning holes, wherein each of the positioning holes has a corresponding bare metal area, each corresponding bare metal area is located on a peripheral of a corresponding position hole of the at least two positioning holes, two of the at least two positioning holes diagonally disposed on the substrate;

a chip, disposed on the substrate;

a heat dissipation element, disposed on the chip and having two fixing holes and a plurality of heat dissipation fins, wherein each of the fixing holes is located between the plurality of heat dissipation fins;

conductive elements, each contacted with the corresponding bare metal area and the heat dissipation element, and connected electrically to the corresponding bare metal area and the heat dissipation element, each of the conductive elements comprises a first junction, a second junction and a bridge portion, wherein the first junction is connected electrically to the heat dissipation element, the second junction has at least two second semi-circular bulges, the second junction is connected electrically to the corresponding bare metal area through at least one of the second semi-circular bulges, two ends of the bridge portion are connected electrically to the first junction and the second junction respectively, and the bridge portion provides an elastic force, so that the second junction presses against the corresponding bare metal area; and at least two fixing parts, each of the fixing parts passing through a corresponding fixing hole of the fixing holes and connected to the corresponding positioning hole, so as to fix the heat dissipation element to the substrate.

6. The circuit board according to claim 5, wherein the first junction has a first through hole, the second junction has a second through hole, and a corresponding fixing part of the fixing parts passes through the first through hole, the corresponding fixing hole, and the second through hole to press the first junction to a surface of the heat dissipation element.

7. The circuit board according to claim 5, wherein the fixing part comprises a spring, the spring presses against the first junction so that the first junction electrically contacts with a surface of the heat dissipation element.

8. The circuit board according to claim 5, wherein the first junction has at least two first semi-circular bulges, and the first junction is connected electrically to the heat dissipation element through at least one of the first semi-circular bulges.

* * * * *